(12) United States Patent
Slanker et al.

(10) Patent No.: US 9,366,549 B2
(45) Date of Patent: Jun. 14, 2016

(54) STATE SENSOR SYSTEMS AND METHODS

(71) Applicant: Goodrich Corporation, Charlotte, NC (US)

(72) Inventors: Andrew Joseph Slanker, Fairborn, OH (US); Herbert S. Summers, Trotwood, OH (US); Joseph E. Beason, Kettering, OH (US)

(73) Assignee: Goodrich Corporation, Charlotte, NC (US)

( * ) Notice: Subject to any disclaimer, the term of this patent is extended or adjusted under 35 U.S.C. 154(b) by 197 days.

(21) Appl. No.: 14/248,752

(22) Filed: Apr. 9, 2014

(65) Prior Publication Data

US 2015/0292911 A1    Oct. 15, 2015

(51) Int. Cl.

| | | |
|---|---|---|
| *F01D 5/20* | (2006.01) | |
| *G01D 5/20* | (2006.01) | |
| *B60T 17/18* | (2006.01) | |
| *G01R 19/00* | (2006.01) | |
| *B60T 13/74* | (2006.01) | |
| *B60T 17/22* | (2006.01) | |
| *F16D 66/00* | (2006.01) | |
| *F16D 121/18* | (2012.01) | |

(52) U.S. Cl.
CPC ............ *G01D 5/2013* (2013.01); *B60T 13/748* (2013.01); *B60T 17/18* (2013.01); *B60T 17/221* (2013.01); *G01R 19/0092* (2013.01); *F16D 2066/003* (2013.01); *F16D 2121/18* (2013.01)

(58) Field of Classification Search
CPC ........... G05B 2219/42297; G05B 2219/41203; G05B 2219/41125; B60T 13/741; B60T 17/18; B60T 17/221; G01B 7/30; G01D 5/20; G01D 5/2013; F16D 55/02; F16D 2121/18; F16D 2121/22; F16D 2121/24; F16D 2066/003; H02K 7/1028
See application file for complete search history.

(56) References Cited

U.S. PATENT DOCUMENTS

| | | | | |
|---|---|---|---|---|
| 5,524,484 | A * | 6/1996 | Sullivan | ............ F16K 37/0083 73/168 |
| 5,532,591 | A | 7/1996 | Logue | |
| 5,998,899 | A | 12/1999 | Rosen et al. | |
| 2004/0036370 | A1 * | 2/2004 | Hilzinger | ............ B60T 13/741 310/83 |
| 2004/0145373 | A1 * | 7/2004 | Knecht | ............ G01R 19/0092 324/522 |

OTHER PUBLICATIONS

Extended European Search Report dated Dec. 1, 2015 in European Application No. 15161320.5.

* cited by examiner

*Primary Examiner* — Son Le
(74) *Attorney, Agent, or Firm* — Snell & Wilmer L.L.P.

(57) ABSTRACT

Sensor systems comprising a magnetic circuit comprising a coil, a magnet, at least one of a ferromagnetic armature plate and a conductive armature plate, wherein the at least one of the ferromagnetic armature plate and the conductive armature plate is configured to move axially in response to at least one of the magnet and the coil, and a controller configured to apply a known first voltage across the coil and monitor a current through the coil are provided. Methods are also provided.

17 Claims, 9 Drawing Sheets

STATE SENSOR SYSTEMS AND METHODS

FIELD

The present disclosure relates to state sensor systems and methods for detecting a change in a property of a magnetic circuit, such as a bi-stable park brake in an electromechanical braking system.

BACKGROUND

Bi-stable electromechanical actuators may take one of two stable states and, thus, when subject to severe vibration or shock, may alter states when power is not supplied to the bi-stable brakes. In that regard, systems and methods for state determination may be beneficial.

SUMMARY

Sensor systems are provided comprising a magnetic circuit comprising a coil, a magnet, at least one of a ferromagnetic armature plate and a conductive armature plate, wherein the at least one of the ferromagnetic armature plate and the conductive armature plate is configured to move axially in response to at least one of the magnet and the coil, and a controller configured to apply a known first voltage across the coil and monitor a current through the coil.

Methods are also provided comprising applying a known first voltage via a controller coupled to a coil forming part of a magnetic circuit, wherein the magnetic circuit comprises a magnet and at least one of a ferromagnetic armature plate and a conductive armature plate configured to move axially, monitoring the known first voltage across the coil, monitoring a first current response through the coil, and determining a phase lag between the known first voltage and the first current response.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical, electrical, and mechanical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to "without contact" (or similar phrases) may also include reduced contact or minimal contact.

In various embodiments, a brake system may comprise an actuator, such as an electromechanical actuator ("EMA"). The EMA may be coupled to or otherwise operate a pressure generating device, such as, for example, a ball screw, a ram, and/or the like. In operation, the EMA may cause the pressure generating device to move and/or exert a force on other brake system structures, such as a brake disk or pad to exert a stopping force on a wheel or other suitable moving structure.

Figure 1:
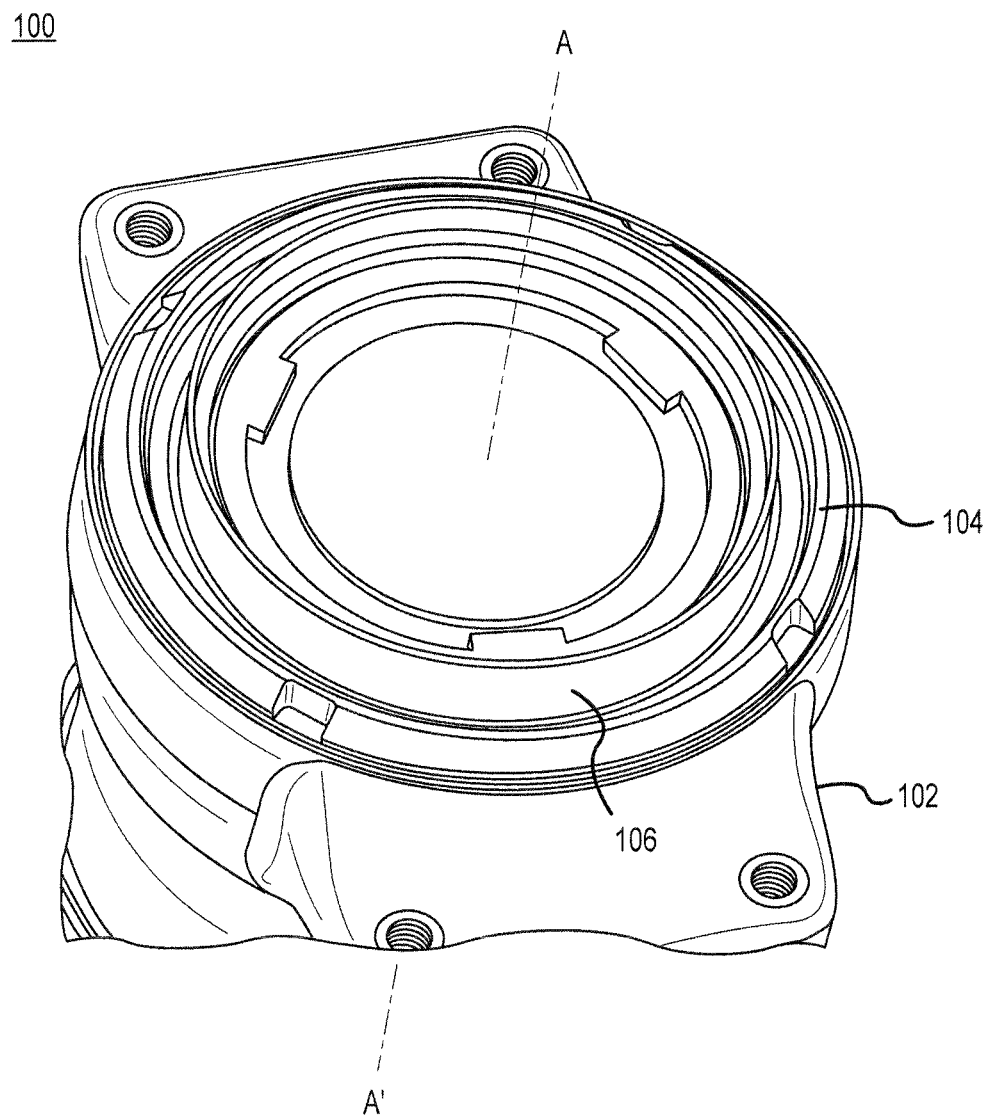
FIG. 1 illustrates an electromechanical actuator, in accordance with various embodiments.

For example, with reference to FIG. 1, a perspective view of an EMA 100 is shown. The EMA may extend along the axis marked A-A'. The EMA 100 may, as described above, be involved in the application of a braking force to an aircraft wheel. The EMA 100 assembly may comprise an EMA housing 102, which may extend along the axis A-A'. The EMA housing 102 may house a variety of components, including, for example, a ball nut 104, a ball screw 106, and a motor drive unit. Generally, the motor drive unit may drive the ball screw 106 through a plurality of rotations. As the ball screw 106 rotates, the ball nut 104 may translate distally and/or proximally along the axis A-A' (depending upon the direction of rotation of the ball screw 106). The ball nut 104 may be coupled to a disc or "puck," at a distal end thereof. The puck may exert a pressure against a brake stack coupled to an aircraft wheel to impede or halt a rolling motion of the wheel. The EMA may include a bi-stable brake.

A brake may be used to prevent an EMA from rotating the ball screw in one state, while permitting rotation of the ball screw in a second state. For example, in a bi-stable brake, prevention of ball screw rotation may be advantageous in a parking brake mode. A bi-stable brake may be switched from one state to another vis-à-vis a friction brake assembly. The friction brake assembly may take a first configuration that prevents ball screw rotation (i.e., a "locked state") and a second configuration that allows ball screw rotation (i.e., an "unlocked state").

Figure 2:
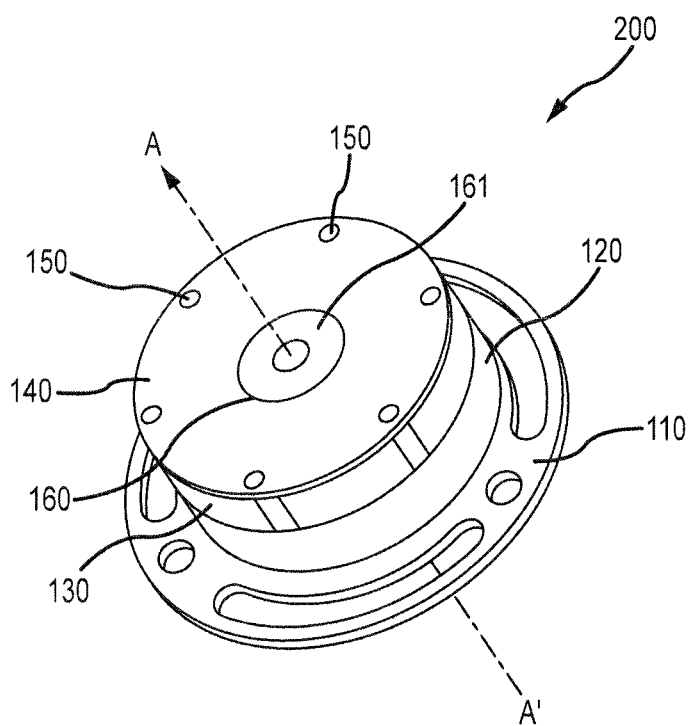
FIG. 2 illustrates a friction brake assembly of an electromechanical actuator, in accordance with various embodiments.

For example, with reference to FIG. 2, FIG. 2 illustrates friction brake assembly 200 that forms part of a park brake feature of an EMA. In various embodiments, friction brake assembly 200 may be internal to an actuator, such as EMA 100 shown in FIG. 1. Friction brake assembly 200 may comprise a friction brake base 110, a magnetic body 120, pressure plate 140, and an armature plate 130 configured to move axially along the A-A' axis around motor shaft 161 contained within motor shaft housing 160. In various embodiments, armature plate 130 may have various characteristics and functions, such as for example, armature plate 130 may be at least one of a ferromagnetic plate or a conductive plate. The friction brake assembly may be held together by screws 150.

Figure 3A:
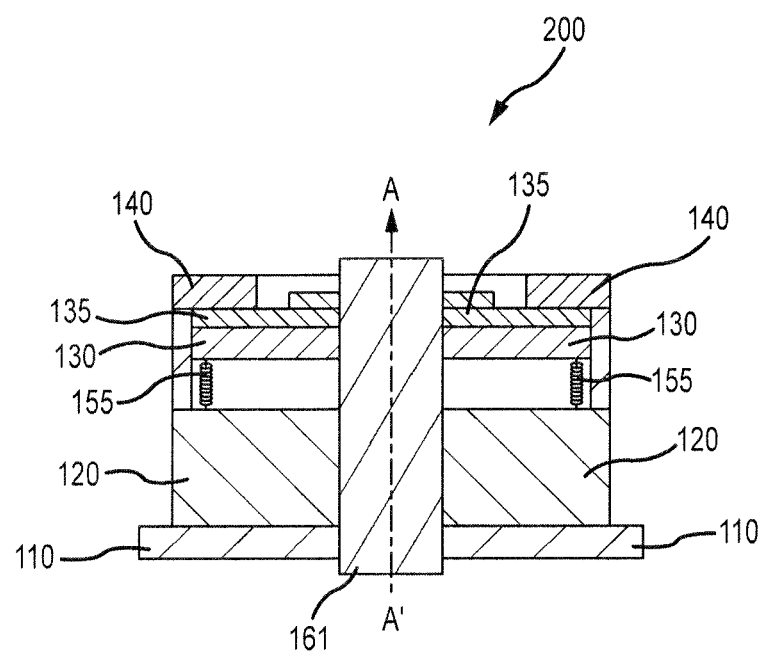
FIG. 3A illustrates a cross-sectional view of an engaged state of a friction brake assembly of an electromechanical actuator, in accordance with various embodiments.
Figure 3B:
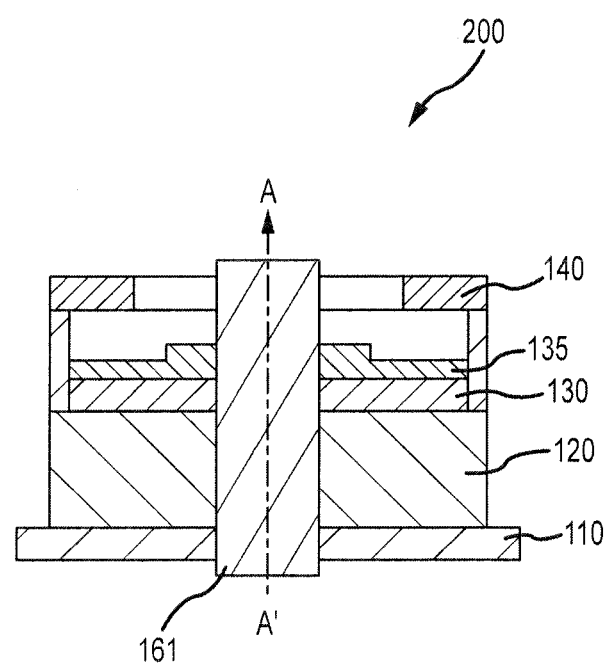
FIG. 3B illustrates a cross-sectional view of a disengaged state of a friction brake assembly of an electromechanical actuator, in accordance with various embodiments.

With reference to FIGS. 3A and 3B, FIG. 3A illustrates the friction brake assembly 200 in the engaged state (the locked state) and FIG. 3B illustrates the friction brake assembly 200 in the disengaged (the unlocked state) in various embodiments. As demonstrated in FIG. 3A, when the brake assembly is in the engaged state, the armature plate 130 and the friction disk 135 may be held away from the magnetic body 120 coupled to friction brake base 110, and may be retained against the pressure plate 140 by the force of springs 155. Due to the clamping force at the pressure plate 140, the motor shaft 161, is prevented from rotating around the axis marked A-A'.

For example, to change the friction brake assembly from the engaged state to the disengaged state (e.g., from FIG. 3A to FIG. 3B), the magnetic body 120 may be polarized to overcome the spring force from springs 155. In various embodiments, the spring may be the dominant force in the disengaged state and the magnets may be the dominant force in the engaged state. In various embodiments, the polarization of magnetic body 120 may draw the armature plate 130 and the friction disk 135 axially (e.g., along axis A-A') to the magnetic body 120 coupled to friction brake base 110, as illustrated in FIG. 3B. In various embodiments, the release of pressure between the pressure plate 140 and the friction disk 135 may allow the motor shaft 161 to rotate unrestricted about the axis marked A-A'.

Figure 4:
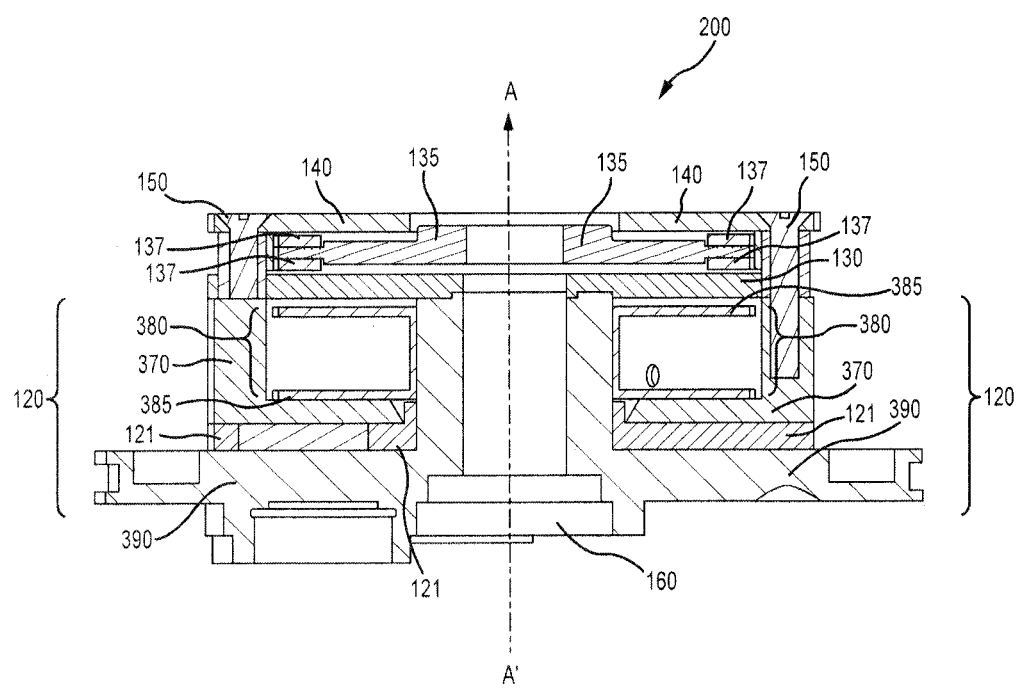
FIG. 4 illustrates a cross-sectional view of an engaged state of a friction brake assembly of an electromechanical actuator, in accordance with various embodiments.

With reference to FIG. 4, FIG. 4 illustrates a cross-sectional view of an engaged bi-stable friction brake assembly in various embodiments. FIG. 4 illustrates friction brake assembly 200, with magnetic body 120 illustrated in further detail. In various embodiments, magnetic body 120 may comprise an inner pole 390, an outer pole 370, a coil pack 380, and magnets 121 positioned concentrically around motor shaft 161. Coil 385 may form part of a coil pack 380 in various embodiments. In various embodiments, the armature plate 130 may be configured to move axially (e.g., along axis A-A') in response to at least one of the magnets 121 or the coil 385. At times when the coil pack 380 does not polarize the magnetic body 120, the armature plate 130 may force the friction disk 135 and the friction pads 137 along motor shaft housing 160 into contact with the pressure plate 140 due to the force of the springs 155 (illustrated above in FIG. 3A) and held together by screws 150. In various embodiments, the relative positioning of the inner pole 390, the outer pole 370, the coil pack 380, the magnets 121, and the armature plate 130 may form a magnetic circuit, as described below.

Bi-stable brakes may transition or switch from one state to another, for example, when subject to large vibrations or shock, such as may occur during high levels of inflight turbulence. In various embodiments, sensor systems provided herein may be able to determine the state of a friction brake assembly by, for example, determining the axial position of armature plate 130 and, thus, determine the state of the friction brake assembly 200. In various embodiments, the determination of the axial position of the armature plate 130 may be accomplished without changing the state of the friction brake assembly 200.

Figure 5:
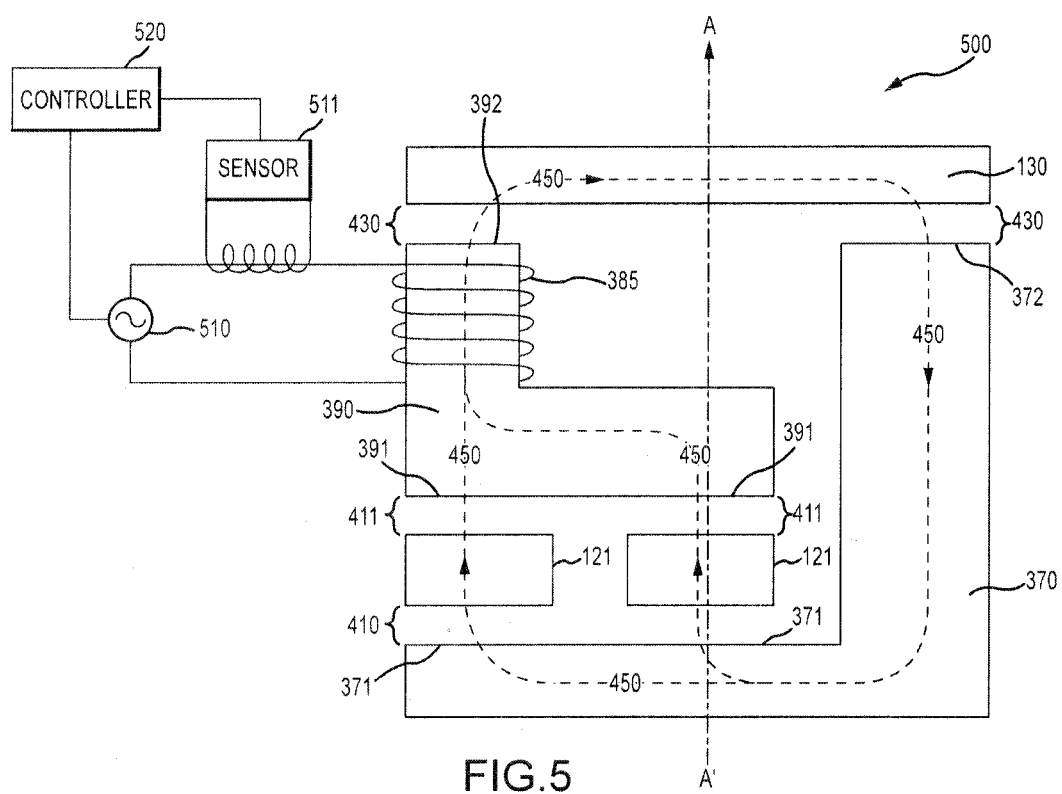
FIG. 5 illustrates a sensor system, in accordance with various embodiments.

FIG. 5 illustrates a sensor system 500 comprising magnetic circuit 450, magnets 121, armature plate 130, controller 520, and coil 385 in various embodiments. In various embodiments, magnets 121 may be disposed between a first portion 391 of the inner pole 390 (e.g., forming second fixed air gap 411) and a first portion 371 of the outer pole 370 (forming first fixed air gap 410). Armature plate 130 may be disposed in axial proximity to a second portion 392 of the inner pole 390 and a second portion 372 of the outer pole 370, forming part of the magnetic circuit 450. In various embodiments, coil 385 may be configured to induce a magnetic field in magnetic circuit 450. As illustrated in FIG. 5, in various embodiments, coil 385 may surround at least a part of inner pole 390 (e.g., coil 385 may surround second portion 392 of inner pole 390). In various embodiments, coil 385 may be coupled to a controller 520 configured to apply a known first voltage across the coil 385 and monitor a current through the coil 385.

In various embodiments, controller 520 may be configured to monitor a current through the coil 385, for example by being coupled to sensor 511. Moreover, in various embodiments, the controller 520 may be configured to detect a change in a current. For example, the controller 520 may be configured to detect a change in an eddy current. In various embodiments, sensor 511 may be configured to sense a change in a property of the magnetic circuit 450 (e.g., an inductive reactance). In various embodiments, sensor 511 may also be a current sensor configured to measure a current provided to the coil 385 according various embodiments.

For example, the sensor 511 may be configured to measure the phase lag of the circuit. As used herein, the term "phase lag" may include the delay between the time a voltage signal rises and the time a current signal rises. Thus, in various embodiments, the phase lag may be used to derive the inductive reactance of the magnetic circuit 450. In various embodiments, it has been found that the phase lag may be used to determine the axial position of armature plate 130 of sensor system 500. In various embodiments, the phase lag may be used to determine the axial height of dynamic gap 430.

Signal generator 510 may be configured to provide a known first voltage at a first frequency to coil 385 in various embodiments. In various embodiments, signal generator 510 may also be configured to cause a known second voltage, wherein the known second voltage is at a frequency that is different from the known first voltage.

In various embodiments, a controller 520 may receive a signal from the sensor 511 and determine an axial position (e.g., the axial height of dynamic gap 430) of the armature plate 130. In various embodiments, the controller 520 may be configured to apply a known first voltage and/or a known second voltage, for example, controller 520 may be in electrical communication with the signal generator 510. Moreover, in various embodiments, the sensor 511 and the signal generator 510 may comprise part of the controller 520. In various embodiments, the controller 520 may form part of an actuator, such as EMA 100 illustrated in FIG. 1. Thus, in various embodiments, the controller 520 may be part of an electromechanical actuator controller ("EMAC").

Figure 6:
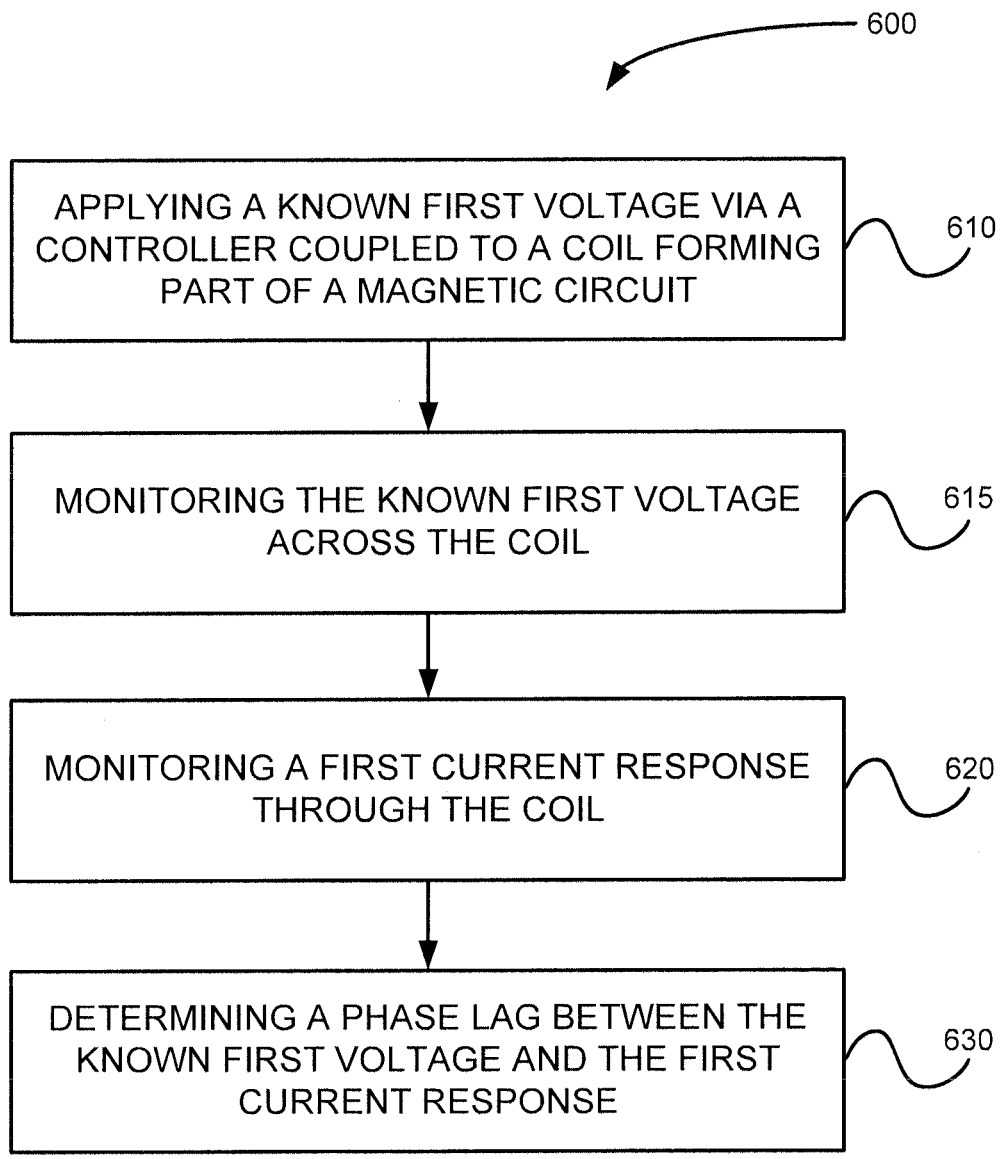
FIG. 6 illustrates a method, in accordance with various embodiments.

FIG. 6 illustrates a method in accordance with various embodiments. Method 600 may comprise applying a known first voltage via a controller 520 coupled to a coil 385 forming part of a magnetic circuit 450, as shown in FIG. 5 (step 610). In various embodiments, the nature of the known first voltage is not particularly limited. Further, in various embodiments, the methods of generating the known first voltage are not particularly limited and may, for example, include generating the known first voltage via a pulse-width modulator. The particular type of waveforms are not particularly limited and may include square, triangular, sinusoidal, trapezoidal, half-sine, exponential or other periodic waveforms. The frequency of the waveforms is not particularly limited and may vary, for example due to the inductance and resistance of the magnetic circuit. Exemplary frequencies, in various embodiments, include frequencies between about 500 Hz and about 15 kHz, about 1 kHz and about 15 kHz, and about 1 kHz to about 10 kHz, where the term "about" in this context only may include±ten percent of the stated value (e.g., about 1 kHz may include 0.9 kHz).

As described above, in various embodiments the coil 385 may form part of a magnetic circuit 450. In various embodiments, the magnetic circuit 450 may comprise an inner pole 390, an outer pole 370, magnets 121, and an armature plate 130 configured to move axially. In various embodiments, the magnetic circuit 450 may also comprise a controller 520 configured to apply a known first voltage across the coil 385 and monitor a current through the coil 385. In various embodiments, the controller 520 may be configured to sense a change in a property of the magnetic circuit 450 (e.g., an inductive reactance), wherein the coil 385 is configured to induce a magnetic field in the magnetic circuit 450.

After the known first voltage is applied (step 610), the known first voltage may be monitored across the coil 385 shown in FIG. 5 (step 615). In various embodiments, a current response may be monitored (step 620). The phase lag between the known first voltage and the first current response may then be determined in various embodiments (step 630). In various embodiments, the determination of the phase lag between the known first voltage and the first current response (step 630) may comprise detecting a change in an eddy current (Foucault current) induced by the moving parts (e.g., the armature plate of a brake assembly). In various embodiments, the armature plate may be at least one of a ferromagnetic armature plate or a conductive armature plate. In various embodiments, the change in eddy currents may be monitored by applying a known voltage to the coil 385 (shown in FIG. 5) of at least one of insufficient duration and intensity to cause a state change in a brake assembly (e.g., from locked to unlocked).

In various embodiments, applying a known voltage to the coil 385 may not be of sufficient duration and intensity to cause a brake assembly in an unstable equilibrium (e.g., a partially-engaged state) to change to a stable state (e.g., to a disengaged state or to an engaged state). In that regard, determination of state may still achieved without effecting a change in state. In various embodiments, however, applying a known voltage to the coil 385 may be of sufficient duration and intensity to cause a brake assembly in an unstable equilibrium (e.g., a partially-engaged state) to change to a stable state (e.g., to a disengaged state or to an engaged state). In various embodiments, this may help to ensure that the reported state of a brake assembly is accurate (e.g., prevent a partially-engaged state from being reported as disengaged). Thus, in various embodiments, applying a known voltage to the coil 385 may be of insufficient duration and intensity to cause a brake assembly to change from one stable state to another stable state (e.g., from unlocked to locked), but may be of sufficient duration and intensity to cause a brake assembly to change from an unstable equilibrium to change to a stable state (e.g., from a partially-engaged state to an engaged state).

Figure 7:
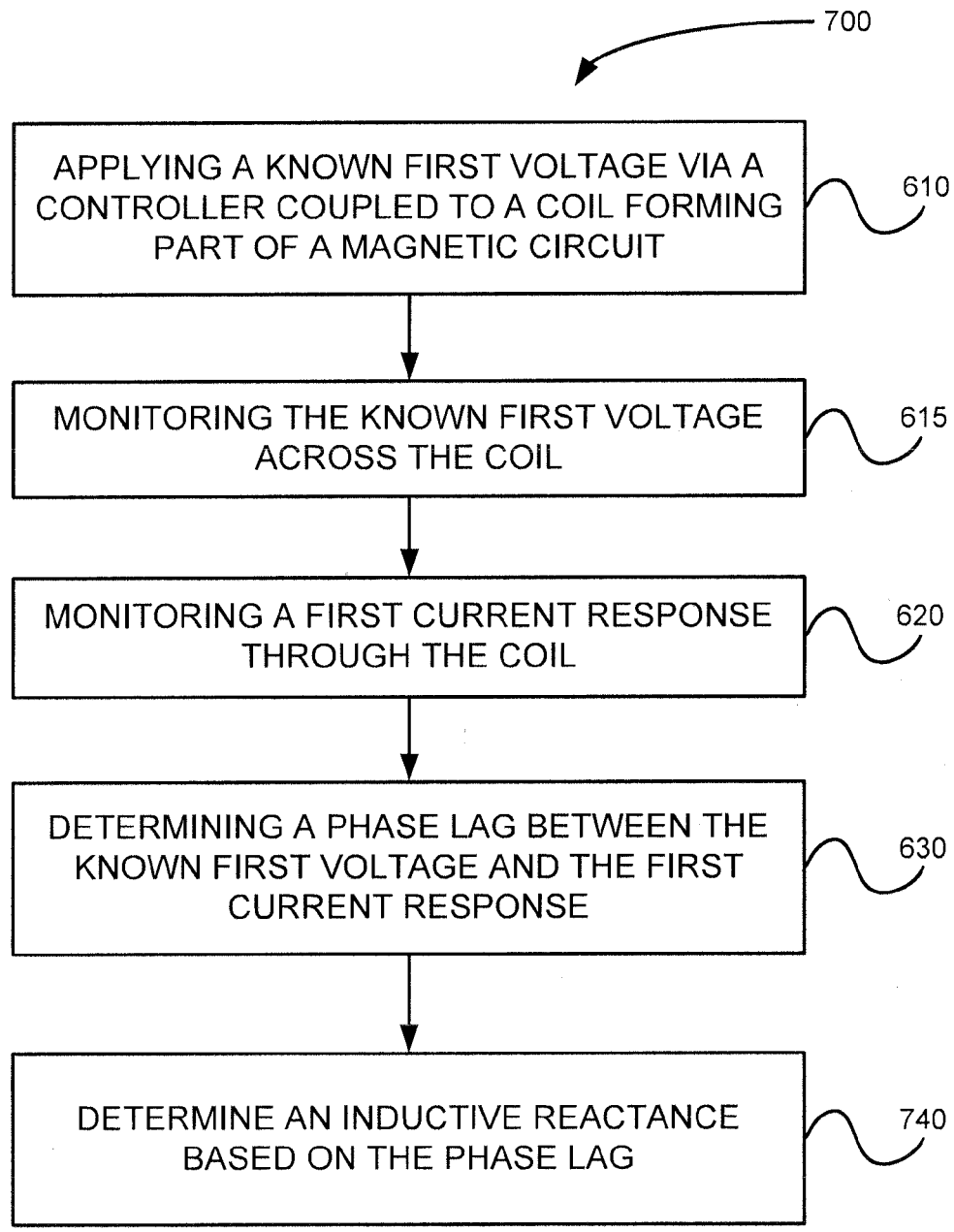
FIG. 7 illustrates a method, in accordance with various embodiments.

With reference to FIG. 7, FIG. 7 illustrates a method for determining an inductive reactance based on a phase lag in accordance with various embodiments. Method 700 may comprise applying a known first voltage via a controller 520 coupled to a coil 385 forming part of a magnetic circuit 450, as shown in FIG. 5 (step 610). In various embodiments, the known first voltage may then be monitored (step 615) and the first current response may then be measured (step 620). In various embodiments, the phase lag between the known first voltage and the first current response may then be determined (step 630). Then, in various embodiments, an inductive reactance based on the phase lag may be determined (step 740).

Figure 8:
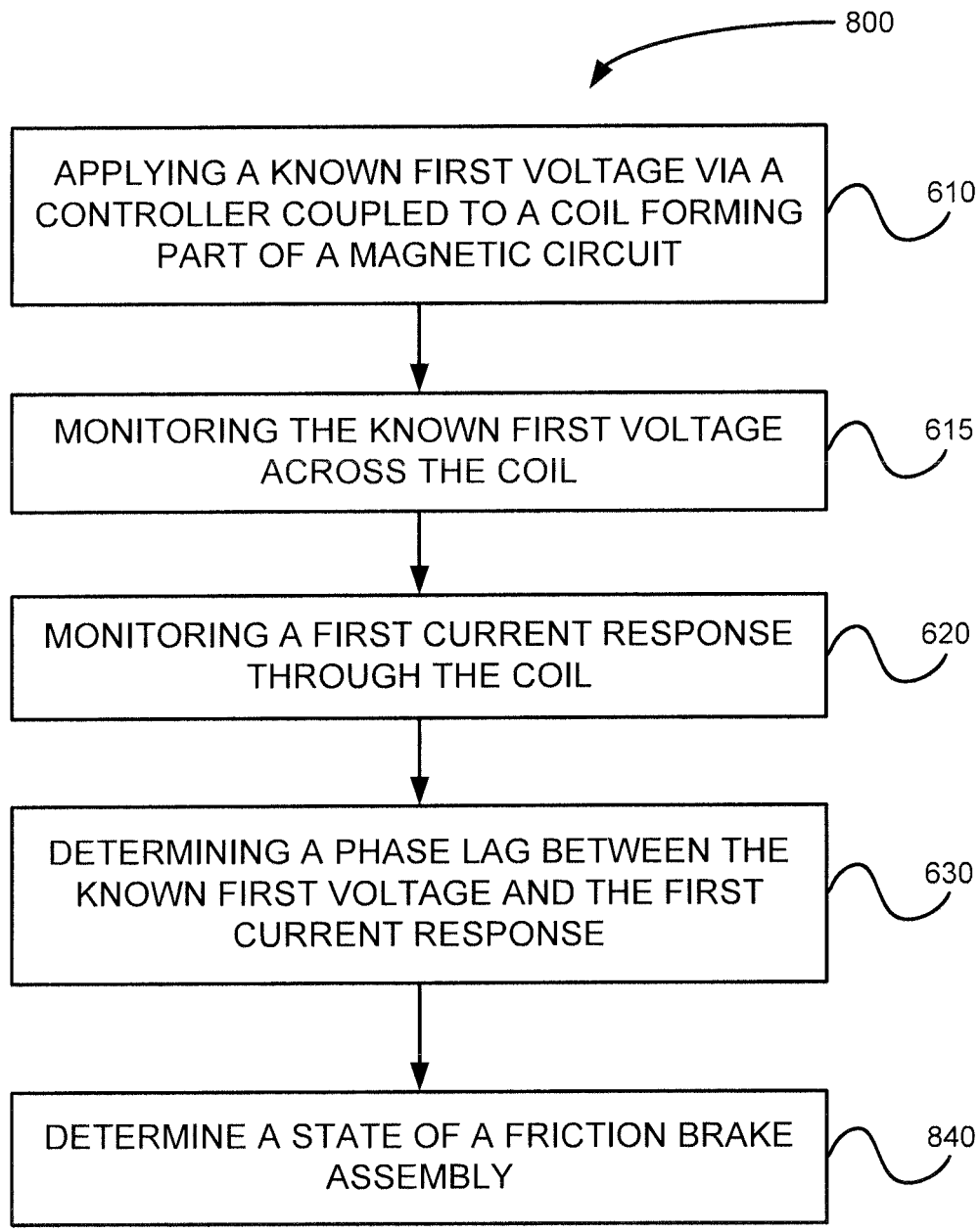
FIG. 8 illustrates a method, in accordance with various embodiments.

With reference to FIG. 8, FIG. 8 illustrates a method for determining the state of friction brake assembly 200 in various embodiments. Method 800 may comprise applying a known first voltage via a controller 520 to a coil 385 forming part of a magnetic circuit 450, as shown in FIG. 5 (step 610). In various embodiments, the known first voltage across the coil 385 may be monitored (step 615) and a first current response may then be monitored (step 620), for example, with sensor 511 (shown in FIG. 5). In various embodiments, a phase lag between the known first voltage and the first current response may then be determined (step 630). In various embodiments, a state of friction brake assembly 200 may then be determined (step 840) (e.g., based on the determined phase lag, inductance, etc.). In various embodiments, the state of friction brake assembly 200 (shown in FIG. 2) may then be sent to a controller 520 (shown in FIG. 5), such as an EMAC.

For example, Table 1 below contains exemplary data in various embodiments. The exemplary data was obtained from exemplary friction brake assemblies to illustrate the change in inductive reactance between two different frequencies in various embodiments.

First, a 1 kHz sinusoidal excitation frequency signal (e.g., a known first voltage) was sent by a signal generator. Using a sensor configured to sense a change in a property of the magnetic circuit of the brake assembly, the friction brake inductance was then determined for both brake assemblies A and B, in both the engaged and disengaged state.

Then a 10 kHz sinusoidal excitation frequency signal (e.g., a known second voltage) was sent by a signal generator. Using the sensor configured to sense a change in a property of the magnetic circuit of the brake assembly, the friction brake inductance was then determined for both brake assemblies A and B, in both the engaged and disengaged state. The results observed and recorded are reflected in Table 1 below.

TABLE 1

Friction Brake Inductance in Engaged and Disengaged States

| | Friction Brake Inductance | | | | | |
|---|---|---|---|---|---|---|
| | Engaged | | Disengaged | | Percent Difference | |
| Brake - Run | 1 kHz | 10 kHz | 1 kHz | 10 kHz | 1 kHz | 10 kHz |
| A-1 | 734.3 | | 548.6 | 271.3 | 25% | |
| A-2 | 691.4* | 310.8* | 548.6 | 271.5 | 21% | 13% |
| A-3 | 736.4 | 317.9 | 550.2 | 271.0 | 25% | 15% |
| B-1 | 734.6 | 320.3 | 576.5 | 280.0 | 22% | 13% |
| B-2 | 731.3 | 324.7 | 571.4 | 277.3 | 22% | 15% |

*Suspected partial engagement

As evidenced by Table 1, the difference in inductance was greater than 20% for both the engaged and disengaged states for a 1 kHz sinusoidal excitation frequency signal. This was determined to be a detectable level, capable of indicating the state of the brake assembly to a controller, for example, to an EMAC.

Moreover, as also evidenced by Table 1, the difference in inductance was greater than 13% for both the engaged and disengaged states for a 10 kHz sinusoidal excitation frequency signal. This is also a detectable level, capable of indicating the state of the brake assembly to a controller, for example, to an EMAC.

Furthermore, in various embodiments, the inductive component of the reactance can be isolated by taking data at multiple significantly different frequencies (e.g., by an order of magnitude of about one). This may help eliminate the need for a temperature measurement of the circuit, because although resistance is temperature dependent, the inductive reactance may be isolated with the use of two different frequencies (e.g., a known first voltage and a known second voltage).

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosed embodiments. The scope of the claimed embodiments is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. §112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A sensor system comprising:
    a magnetic circuit comprising a coil;
    a magnet;
    at least one of a ferromagnetic armature plate and a conductive armature plate, wherein the at least one of the ferromagnetic armature plate and the conductive armature plate is configured to move axially in response to at least one of the magnet and the coil; and
    a controller configured to apply a known first voltage across the coil and monitor a current through the coil;
    an inner pole; and
    an outer pole, wherein the coil is in proximity to at least one of the inner pole and the outer pole, and the magnet is disposed between a first portion of the inner pole and a first portion of the outer pole, and the at least one of the ferromagnetic armature plate and the conductive armature plate is disposed in axial proximity to a second portion of the inner pole and a second portion of the outer pole, forming the magnetic circuit, wherein the ferromagnetic armature plate is configured to move axially.

2. The sensor system of claim 1, wherein the known first voltage has a frequency between about 500 Hz and 15 kHz.

3. The sensor system of claim 2, wherein the controller is configured to provide the known first voltage via pulse-width modulation.

4. The sensor system of claim 2, wherein the controller is configured to apply a known second voltage, wherein the known second voltage comprises a frequency that is different than the known first voltage.

5. The sensor system of claim 1, wherein the controller is configured to detect a change in an eddy current.

6. The sensor system of claim 1, wherein the controller is configured to determine an inductive reactance.

7. The sensor system of claim 1, wherein the coil surrounds at least a part of the inner pole.

8. A friction brake assembly comprising the sensor system of claim 1.

9. The sensor system of claim 1, wherein the controller is an electromechanical actuator controller ("EMAC") and is configured to determine an axial position of the at least one of the ferromagnetic armature plate and the conductive armature plate.

10. The method of claim 1, wherein the controller is configured to determine an axial height of a dynamic gap between the at least one of a ferromagnetic armature plate and a conductive armature plate and at least one of an inner pole, an outer pole or a magnet.

11. The method of claim 8, wherein the controller is configured to determine an axial height of a dynamic gap between the at least one of a ferromagnetic armature plate and a conductive armature plate and at least one of an inner pole, an outer pole or a magnet.

12. A method comprising:
    applying a known first voltage via a controller coupled to a coil forming part of a magnetic circuit, wherein the magnetic circuit comprises:
    a magnet and at least one of a ferromagnetic armature plate and a conductive armature plate configured to move axially;
    an inner pole; and
    an outer pole, wherein the coil is in proximity to at least one of the inner pole and the outer pole, and the magnet is disposed between a first portion of the inner pole and a first portion of the outer pole, and the at least one of the ferromagnetic armature plate and the conductive armature plate is disposed in axial proximity to a second portion of the inner pole and a second portion of the outer pole:
    monitoring the known first voltage across the coil;

monitoring a first current response through the coil; and
determining a phase lag between the known first voltage and the first current response.

13. The method of claim 12, further comprising determining an inductive reactance based on the phase lag between the known first voltage and the first current response.

14. The method of claim 12, wherein the known first voltage has a frequency between about 500 Hz and 15 kHz.

15. The method of claim 12, wherein the determining the phase lag between the known first voltage and the first current response comprises detecting a change in an eddy current.

16. The method of claim 12, further comprising determining a state of a friction brake assembly.

17. The method of claim 12, further comprising determining an axial height of a dynamic gap between the at least one of a ferromagnetic armature plate and a conductive armature plate and at least one of an inner pole, an outer pole or a magnet.

* * * * *